United States Patent [19]
Reid et al.

[11] Patent Number: 5,530,585
[45] Date of Patent: Jun. 25, 1996

[54] OPTICAL SOLITON TRANSMISSION SYSTEM

[75] Inventors: John J. E. Reid; Coen T. H. F. Liedenbaum; Giok D. Khoe, all of Eindhoven, Netherlands

[73] Assignee: U.S. Philips Corporation, New York, N.Y.

[21] Appl. No.: 255,615

[22] Filed: Jun. 9, 1994

[30] Foreign Application Priority Data

Jun. 11, 1993 [BE] Belgium .................... 09300596

[51] Int. Cl.⁶ ............... G02B 5/14; H04B 9/00
[52] U.S. Cl. .............. 359/344; 359/341; 359/185; 372/33
[58] Field of Search .................. 359/185, 238, 359/341, 344; 372/33, 50

[56] References Cited

U.S. PATENT DOCUMENTS

| | | | |
|---|---|---|---|
| 4,558,921 | 12/1985 | Hasegawa et al. | 350/96.29 |
| 4,700,339 | 10/1987 | Gordon | 359/344 |
| 5,191,631 | 3/1993 | Rosenberg | 359/173 |

OTHER PUBLICATIONS

"Long Distance Soliton Propagation Using Lumped Amplifiers and Dispersion Shifited Fibre" L. F. Mollenauer et al, IEEE Journal of Lightwave Technology vol. 9, No. 2, Feb. 1991.

"Generation and Transmission of Optical Solitons in the Gigahertz Region Using a Directly Modulated Distributed Feedback Laser Diode" Optics Letters vol. 15, No. 10, May 10, 1990.

SOA 1200 and SOA3200 Data Sheets From BT&D Technologies.

"Picosecond Pulse Generation From A 1.3 μm Distributed Feedback Laser Diode Using Soliton–Effect Compression" H. Liu et al, IEEE Journal of Quantum Electronics, vol. 27, No. 6, Jun. 1991.

*Primary Examiner*—Nelson Moskowitz
*Attorney, Agent, or Firm*—Leroy Eason

[57] ABSTRACT

In an optical soliton transmission system an optical transmitter (2) generating short pulses is coupled to a glass fiber cable (4) comprising sections of glass fiber (7, 9, 11, 13, 15) with interspaced semiconductor laser amplifiers (8, 10, 12, 14). An optical receiver (6) is connected to the end of the glass fiber cable (15). In optical soliton transmission Erbium doped fiber amplifiers and dispersion shifted fiber are currently used in the 1.5 μm wavelength region. However, by utilizing standard fiber in the 1.3 μm wavelength region it is possible to use a lower soliton power compared with a state-of the-art transmission system.

4 Claims, 1 Drawing Sheet

ID NO: 5,530,585

OPTICAL SOLITON TRANSMISSION SYSTEM

The invention relates to an optical soliton transmission system comprising a transmitter which includes a laser for generating optical pulses having energy suitable for generating solitons, the transmitter being coupled to a first end of a glass fibre in which at least an optical amplifier is included, a second end of the glass fibre in this transmission system being coupled to an optical receiver for detecting solitons.

The invention likewise relates to a glass fibre cable to be used in a transmission system of this type.

A transmission system as defined in the opening paragraph is known from the journal article "Long-Distance Soliton Propagation Using Lumped Amplifiers and Dispersion Shifted Fibre" by L. F. Mollenauer et. al. in IEEE Journal of Lightwave Technology, vol. 9, no. 2, February 1991.

In optical transmission systems for information transport over large distances, such as, for example, between different continents, an optical transmitter comprising a laser is used for converting a digital electric signal into optical pulses. These pulses are transported through the glass fibre to an optical receiver and reconverted into a digital electric signal.

In the glass fibre the transmitted pulses are attenuated by the attenuation of the glass fibre. In addition, the width of the transmitted pulses increases as the length of the glass fibre increases. This pulse widening is caused by the fact that the delay in the glass fibre for light having different wavelengths is different. This property of a glass fibre is called dispersion. Since a light pulse transmitted by the optical transmitter always contains components having different wavelengths, certain components of the light pulse will arrive earlier at the optical receiver than components having a different wavelength, so that the optical pulses are widened.

To reduce the detrimental effects of attenuation and pulse widening, so-called regenerative repeaters are included at regular distances in the glass fibre. Such a repeater receives light pulses from the glass fibre and converts them into a digital electric signal. This digital electric signal is then reconverted into optical pulses having the original width. If a sufficient number of repeaters is included in the transmission system, a good transmission quality is possible over large distances. The required regenerative repeaters, however, are rather complicated, which leads to high costs of the transmission system.

In the transmission system known from said journal article, much more cost-effective optical amplifiers are substituted for regenerative repeaters. In this transmission system non-linear effects in the glass fibre are used to avoid the widening of the optical pulses. If the optical pulses have a certain amount of power, an effect of pulse narrowing due to a non-linear effect will occur in addition to the effect of pulse widening caused by dispersion. If the power of the optical pulses assumes a certain value, it is possible for the effects of pulse widening and pulse narrowing to cancel each other out and the width of the pulse to remain equal. The necessary pulse power is proportional to the dispersion of the glass fibre, so that the dispersion of the glass fibre must not be too high to keep the necessary pulse power within acceptable limits. For this purpose, so-called dispersion shifted fibre known from said journal article is used. This fibre has considerably less dispersion, so that the necessary pulse power is considerably smaller. Less dispersion is obtained by adding doping material to the glass fibre. The reproducibility of the dispersion value, however, leaves much to be desired. To avoid the sign of the dispersion becoming the reverse to the desired sign due to the sign spreading (negative for common solitons, positive for so-called dark solitons), the absolute value of the dispersion must not be made too low.

SUMMARY OF THE INVENTION

It is an object of the invention to provide a transmission system as defined in the opening paragraph, in which the problems due to dispersion spreading in a dispersion shifted fibre are reduced.

For this purpose, the invention is characterized in that the laser is arranged for generating light in the 1.3 µm wavelength region and in that the glass fibre comprises standard single mode glass fibre.

For transmission in the 1.3 µm wavelength region, standard single mode fibre has very little dispersion which, furthermore, is much better determined than the dispersion of dispersion shifted fibre. As a result, less nominal dispersion may be selected, because the spreading of dispersion need not be taken into account. This leads to less required pulse power. In addition, it is no longer necessary to adapt the gain of each optical amplifier to an individual fibre. The required power is additionally reduced because this required power is proportional to the third power of the wavelength.

An additional advantage is that the amplifiers may be farther apart. The reason for this is that the spacing of the amplifiers is to be smaller than a certain factor times the so-called soliton period, which soliton period is inversely proportional to the squared wavelength.

A further additional advantage is that existing transmission systems which nearly always operate with standard single mode fibres can be simply adapted for transmission at much higher transmission rates by merely substituting optical amplifiers for the regenerative repeaters.

An embodiment of the invention is characterized in that the optical amplifier comprises a semiconductor laser amplifier.

A semiconductor laser amplifier is significantly simpler than an Erbium doped fibre amplifier utilized in prior-art transmission system. In addition, an Erbium doped fibre amplifier is unsuitable for wavelengths in the 1.3 µm region.

BRIEF DESCRIPTION OF THE DRAWINGS

The invention will be further explained with reference to the drawing Figures in which.

DETAILED DESCRIPTION OF THE PREFERRED EMBODIMENT

Figure 1:
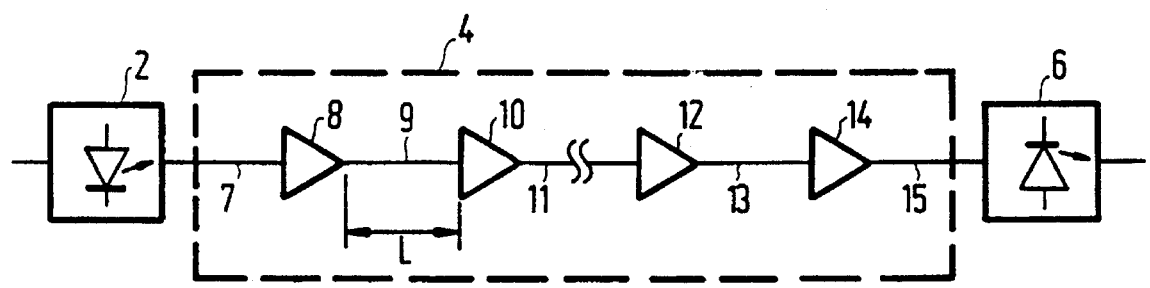
FIG. 1 shows a transmission system according to the invention.

In the transmission system as shown in FIG. 1 a digital signal to be transmitted is applied to an optical transmitter 2. The output of the optical transmitter 2 is connected to an input of a glass fibre cable 4 whose output is connected to an input of an optical receiver 6. The transmitted digital signal is available on the output of the optical receiver 6.

The optical cable 4 comprises a plurality of glass fibre sections 7, 9, 11, 13 and 15, while optical amplifiers 8, 10, 12 and 14, here being semiconductor laser amplifiers, are arranged in between. The spacing of the semiconductor laser amplifiers is a uniform distance L.

The digital signal to be transmitted is converted by the optical transmitter 2 into optical pulses having a width from several picoseconds to several tens of picoseconds. Such an optical transmitter is described in the journal article "Generation and transmission of optical solitons in the gigahertz region using a directly modulated distributed feedback laser diode", in Optics Letters, vol. 15, no. 10, 15 May 1990, FIG. 1. There should be observed that for implementing the invention the 1.5 μm laser diode is to be replaced by a 1.3 μm laser diode and that the Erbium doped fibre amplifier is to be replaced by an amplifier capable of amplifying the light having a wavelength of 1.3 μm, such as, for example, a semiconductor laser amplifier or a Praseodymium doped fibre amplifier. From the journal article by Mollenauer et. al. is known that for maintaining the soliton transmission the mean power $P_{sol}$ of the light pulse over the fibre length is to be equal to:

$$P_{sol} = 0.776 \frac{\lambda^3 A_{eff} |D|}{\pi^2 c n_2 \tau^2} \quad (1)$$

In (1) is $\lambda$ the wavelength of the laser light transmitted by the optical transmitter, $A_{eff}$ the effective cross-section of the glass fibre, D the dispersion of the glass fibre, c the velocity of light, $n_2$ is a non-linear term of the refraction index of the fibre, and $\tau$ is the pulse width of the optical soliton. In a state-of-the-art transmission system having a pulse width of 15 pS, a wavelength of 1.5 μm, an effective fibre cross-section of 63 μm², a dispersion of −2 pS/(nm·kin) (dispersion shifted fibre) and a value of $3.2 \cdot 10^{-16}$ cm²/W for $n_2$, a value of 15.5 mW is found for $P_{sol}$. Since the dispersion shows little spreading in a standard single mode fibre, the wavelength of the laser 2 may be selected in the 1.3 μm region, so that the dispersion is, for example, 0.5 pS/(nm·kin), without the risk of dispersion becoming positive due to the spreading of the fibre properties. For the necessary soliton power in a transmission system according to the invention ($\lambda$=1.3 μm, D=−0.5) a value of 2.5 mW is found then.

The glass fibre sections 7, 9, 11, 13 and 15 have a length L determined by the fibre attenuation or by the soliton period. With a given maximum output power $P_{max}$ of each amplifier and the necessary soliton power $P_{sol}$, a maximum permissible length of the glass fibre follows from equation, wherein (2) $\alpha$ is the attenuation of the glass fibre in Nepers per unit length.

$$\frac{P_{sol}}{P_{max}} = \frac{1 - e^{-\alpha L}}{\alpha L} \quad (2)$$

With a maximum amplifier output power (peak power) of 40 mW and a required soliton power of 2.5 mW, the solution of (2) results in a value of 16 for $\alpha L$. This means a maximum permissible attenuation by the fibre of 69 dB. With an attenuation of 0.35 dB per kin, a maximum value of 200 km is found for L. There should be noted that it may be necessary to have a cascade combination of more optical amplifiers to realise the necessary optical amplification.

According to Mollenauer's article the following holds for the soliton period:

$$z_0 = 0.322 \frac{\pi^2 c \tau^2}{\lambda^2 |D|} \quad (3)$$

For a transmission system according to the invention ($\lambda$=1.3 μm, D=0.5) a soliton period of 250 km is found, which results in a value of L<2032 km if L<8$z_0$ is started from. In the situation described above the value of L is restricted by the attenuation of the fibre.

The amplifiers 8, 10, 12 and 14 are, for example, semiconductor laser amplifiers. They are supplied, for example, by BT & D Technologies under the type numbers of SOA 1200 and SOA 3200.

Figure 2:
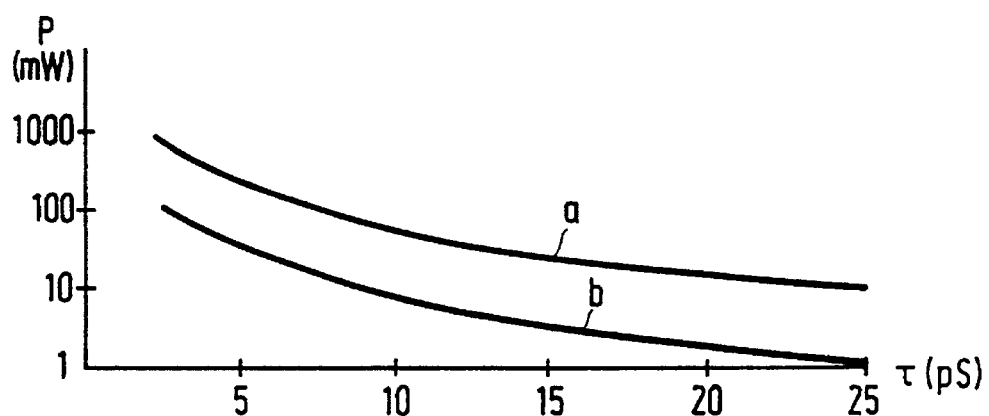
FIG. 2 shows a graph of the necessary power of the soliton plotted against the pulse width of the soliton.

In FIG. 2 the necessary mean soliton power $P_{sol}$ determined according to (1) is plotted against the pulse width expressed in pS. Curve a shows the mean soliton power $P_{sol}$ for a state-of-the-art transmission system, whereas curve b shows this power for a transmission system according to the invention. From FIG. 2 it clearly appears that the necessary soliton power for a transmission system according to the invention is considerably smaller compared with the necessary soliton power in a state-of-the-art transmission system.

Figure 3:
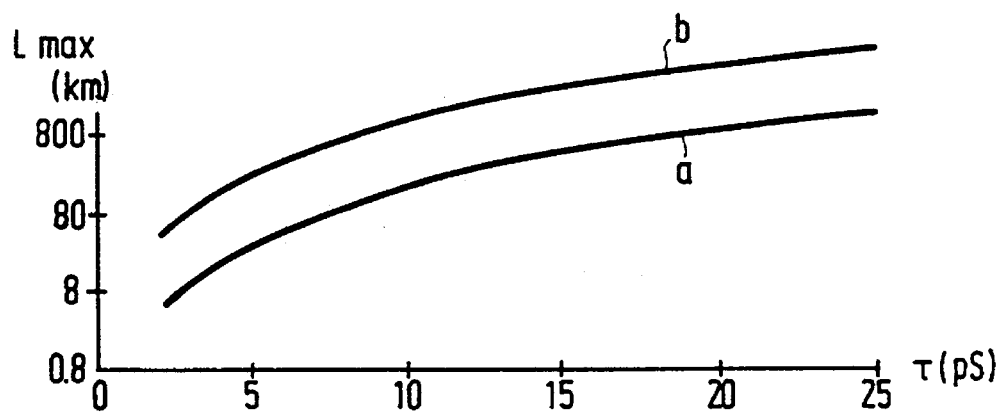
FIG. 3 shows a graph of the maximum permissible spacing of the amplifiers in a transmission system according to the invention plotted against the pulse width of the soliton if the spacing of the amplifiers is selected to be equal to $8.z_0$.

In FIG. 3 the maximum value of L is plotted against the pulse width expressed in pS, in so far as L is restricted by the soliton period. Curve a shows the maximum value of L for a state-of-the-art transmission system, whereas curve b shows this value of L for a transmission system according to the invention. FIG. 2 clearly shows that the maximum value of L is increased considerably relative to this distance in a state-of-the-art transmission system. However, it is noted that the maximum value of L will frequently be restricted by the attenuation of the glass fibre.

We claim:

1. An optical soliton transmission system comprising: a transmitter which includes a laser for generating optical pulses, the transmitter being coupled to a first end of an optical fiber transmission line which includes at least one optical amplifier, the energy of the optical pulses being such that they are transmitted over the optical fiber transmission line in the form of solitons; and a receiver coupled to a second end of the optical fiber transmission line to receive the transmitted solitons; characterized in that the optical pulses are of light having a wavelength of 1.3 μm, and the optical fiber transmission line comprises single mode glass fiber having a group velocity dispersion (D) 0.5 ps/(nm.km).

2. An optical soliton transmission system as claimed in claim 1, wherein the at least one optical amplifier comprises a semiconductor laser amplifier.

3. An optical fiber transmission line which includes at least one optical amplifier, said amplifier being for supplying optical pulses having an energy such that they are transmitted as solitons over the optical fiber transmission line; characterized in that the optical pulses are of light having a wavelength of 1.3 μm, and the optical fiber transmission line comprises single mode glass fiber having a group velocity dispersion (D) 0.5 ps/(nm.km).

4. An optical fiber transmission line as claimed in claim 3, wherein the at least one optical amplifier comprises a semiconductor laser amplifier.

* * * * *